US011892205B2

(12) United States Patent
Sadri et al.

(10) Patent No.: US 11,892,205 B2
(45) Date of Patent: Feb. 6, 2024

(54) HEAT PUMP DEVICE AND ASSEMBLY

(71) Applicant: Bio-Rad Laboratories, Inc., Hercules, CA (US)

(72) Inventors: Amir Sadri, Toronto (CA); Nenad Kircanski, Toronto (CA); Thanh-Vi Tran, Scarborough (CA); Carl Marlowe, San Francisco, CA (US); Brian David Wilson, Pleasant Hill, CA (US)

(73) Assignee: Bio-Rad Laboratories, Inc., Hercules, CA (US)

( * ) Notice: Subject to any disclaimer, the term of this patent is extended or adjusted under 35 U.S.C. 154(b) by 0 days.

(21) Appl. No.: 17/989,938

(22) Filed: Nov. 18, 2022

(65) Prior Publication Data

US 2023/0152011 A1 May 18, 2023

Related U.S. Application Data (62) Division of application No. 16/733,155, filed on Jan. 2, 2020, now Pat. No. 11,549,731.

(Continued)

(51) Int. Cl.
*F25B 21/04* (2006.01)
*B01L 7/00* (2006.01)
(Continued)

(52) U.S. Cl.
CPC ............... *F25B 21/04* (2013.01); *B01L 7/00* (2013.01); *B01L 7/52* (2013.01); *H10N 10/10* (2023.02);
(Continued)

(58) Field of Classification Search
None
See application file for complete search history.

(56) References Cited

U.S. PATENT DOCUMENTS 7,958,736 B2 6/2011 Banerji et al.
7,995,573 B2 8/2011 Danzeisen et al.
(Continued)

OTHER PUBLICATIONS

International Search Report and Written Opinion in PCT/US2020/012095 dated Mar. 10, 2020; 16 pages.
(Continued)

*Primary Examiner* — Daniel P Malley, Jr.
(74) *Attorney, Agent, or Firm* — Kilpatrick Townsend and Stockton LLP (57) ABSTRACT

A heat pump that includes a thermoelectric device(s) and a heat sink having a raised portion with a top surface for thermally coupling with a planar face of the thermoelectric device(s). The raised portion of the heat sink includes an outer periphery and a raised central region surrounded by a void region to provide more uniform thermal conductivity when clamped within an assembly. The raised central region is shaped in an any shape corresponding to a shape of uneven thermal conductivity due to clamping pressure applied to the heat sink. The void region can be substantially contiguous and entirely circumscribe the central raised region. The device can optionally include discrete supports formed of a less thermally-conductive material within the void region. The supports can be elastomeric, such as O-rings, and disposed within pockets defined within the void region.

22 Claims, 8 Drawing Sheets

Related U.S. Application Data (60) Provisional application No. 62/792,345, filed on Jan. 14, 2019.

(51) Int. Cl.
  *H10N 10/10* (2023.01)
  *H10N 10/80* (2023.01)

(52) U.S. Cl.
  CPC .......... *H10N 10/80* (2023.02); *B01L 2300/08* (2013.01); *B01L 2300/123* (2013.01); *B01L 2300/1805* (2013.01)

(56) References Cited

U.S. PATENT DOCUMENTS

| | | |
|---|---|---|
| 2005/0009070 A1 | 1/2005 | Arciniegas et al. |
| 2006/0065652 A1 | 3/2006 | Brown |
| 2006/0101830 A1 | 5/2006 | Cohen et al. |
| 2006/0121602 A1* | 6/2006 | Hoshizaki ............ F21V 29/763 422/63 |
| 2008/0003649 A1* | 1/2008 | Maltezos ............ B01L 3/50851 435/286.1 |
| 2008/0314557 A1* | 12/2008 | Banerji .................... B01L 7/52 165/80.3 |
| 2011/0056661 A1 | 3/2011 | Wojtowicz et al. |
| 2011/0151519 A1* | 6/2011 | Tasch .................. B01L 3/50851 435/91.2 |
| 2012/0149020 A1 | 6/2012 | Alvino et al. |
| 2015/0231636 A1* | 8/2015 | Lim ........................ B01L 7/52 435/286.1 |
| 2017/0072398 A1 | 3/2017 | Moon et al. |
| 2018/0311672 A1 | 11/2018 | Shin et al. |

OTHER PUBLICATIONS

Extended European Search Report in EP Appln. 20741760.1 dated Sep. 8, 2022; 8 pages.

\* cited by examiner

HEAT PUMP DEVICE AND ASSEMBLY

CROSS-REFERENCE TO RELATED APPLICATIONS

The present application is a divisional of U.S. patent application Ser. No. 16/733,155, filed Jan. 2, 2020, which claims the benefit of priority to U.S. Provisional Patent Application No. 62/792,345, filed Jan. 14, 2019, the contents of each of which are hereby incorporated by reference herein in their entireties for all purposes.

BACKGROUND OF THE INVENTION

1. Field of the Invention

This invention pertains to heat pumps and heat sink assemblies, in particular, heat pumps and heat sinks for thermal cycling of chemical or biological samples.

2. Description of the Prior Art

Heat pumps are widely used for thermal cycling of sample blocks, which are metal blocks that hold reaction receptacles for chemical and biochemical testing, particularly multiple tubes or multi-receptacle plates. Such sample blocks typically contain a planar array of depressions or wells with a separate sample receptacle in each well. Testing procedures commonly performed on samples in a sample block often entail maintaining precise temperature control and heating and cooling the samples in discrete, programmed steps.

The polymerase chain reaction (PCR) is one of many examples of chemical processes that are performed on multiple samples and require precise temperature control with rapid temperature changes between different stages of the procedure. PCR amplifies DNA, i.e., it produces multiple copies of a DNA sequence from a single copy. PCR is typically performed in instruments that provide reagent transfer, temperature control, and optical detection in a multitude of reaction vessels such as microplates, tubes, or capillaries. The various stages of the procedure are temperature-sensitive, with different stages performed at different temperatures and maintained for designated periods of time, and the sequence is repeated in cycles. In a typical procedure, a sample is first heated to about 95° C. to "melt" (separate) double strands, then cooled to about 55° C. to anneal (hybridize) primers to the separated strands, and then reheated to about 72° C. to achieve primer extension through the use of the polymerase enzyme. This sequence is repeated to achieve multiples of the product DNA, and the time consumed by each cycle can vary from a fraction of a minute to two minutes, depending on the equipment, the scale of the reaction, and the degree of automation. Another example of a chemical process that involves temperature changes and a high degree of control is nucleic acid sequencing. Still further examples will be apparent to those knowledgeable in the fields of molecular biology and biochemistry in general.

The processes cited above are frequently performed on large numbers of samples, each of a relatively small volume, often on the microliter scale, using automated laboratory equipment. A central component of this equipment is the reaction module, which includes the sample block, a thermoelectric device or array of such devices contacting the underside of the sample block, and a heat sink associated with the thermoelectric device, all with appropriate thermal interfaces and clamped tightly together within an assembly to achieve maximal heat conduction. In some embodiments, adjacent components are directly engaged with each other. In other embodiments, a thermal interface material, such as synthetic graphite (e.g. Tgon), can be used between adjacent components to improve heat distribution.

While improved heat sinks have been proposed that utilize trenches or discrete, specially placed voids along or near the edge of the heat sink slabs to decrease edge losses, there remains anomalies and uneven temperature distributions within the sample block. Thus, there is a need for further improved heat pumps and heat sink assemblies that provides more consistent, uniform temperature distribution and thermal conductivity to provide improved temperature control when thermal cycling a sample block.

BRIEF SUMMARY

Conventional art heat pump arrays and heat sinks are typically included in an overall assembly in which a thermally conductive slab of the heat sink is clamped to the heat pump to ensure consistent thermal contact between a raised top surface of the heat sink slab and one or more thermoelectric devices of the heat pump. The one or more thermoelectric devices can include one or more thermoelectric elements. Typically, the heat pump includes a thermoelectric device having an array of thermoelectric devices thermally coupled between an active face and reference face. In some embodiments, the heat pump can include multiple thermoelectric devices, each having one or more thermoelectric elements. It has been discovered that forces or pressure applied to a thermally conductive materials (e.g. compression, tension) when clamped can alter the inherent thermal conductivity properties of the material, thereby causing uneven temperature distribution and inconsistent heating and cooling of samples during thermal cycling. Therefore, there is further need for heat pumps and heat sink assemblies that can be clamped and secured within an assembly while still providing uniform, more consistent temperature distribution for precisely controlled thermal cycling of a sample block.

In one aspect, the invention pertains to an improved heat pump having a heat sink with a thermally conductive slab with a raised central region that is specially shaped to compensate for an uneven distribution of thermal conductivity. The central region can be surrounded by one or more voids, typically a single continuous void circumscribing the central raised region to improve thermal resistance. Although, some embodiments can also include a void interior to the raised region. In some embodiments, one or more supports or a material of lower thermal conductivity can also be included within the void region to improve structural support while maintaining increased thermal resistance. It is appreciated that the device can be designed without any supports in the void region.

In some embodiments, the heat pump comprises a planar face operably coupled with a plurality of thermoelectric elements (e.g. a reference face of a Peltier device); and a heat sink in thermal contact with the planar face. The heat sink can include a slab of thermally conductive material with a top surface of the slab being thermally coupled with the planar face. The slab includes an outer periphery corresponding to the size and shape of the planar face and a central raised region defined in a shape corresponding to an uneven temperature distribution of the planar face, and a void between the outer periphery and the central raised region. The void substantially surrounds the central raised region so as to improve thermal resistance in this region. In some embodiments, the void is substantially contiguous and can include part or almost complete removal of slab material. In some embodiments, the heat sink slab has a rectangular outer periphery and a central raised region that is substantially oval or circular in shape corresponding to the shape of the uneven temperature distribution. While oval or circular examples are described herein, it is appreciated that the shape of the raised region can be any shape or combination of shapes so long as it corresponds to an uneven temperature distribution. For example, the raised region can be defined as a square, rectangle, or even non-uniform geometries, such as a donut, figure eight, etc. The shape can be contiguous or can be non-contiguous, for example, pillars, multiple shapes of same or varying sizes (e.g. multiple rectangles, circles, etc.) or a combination of differing shapes. In some embodiments, the heat sink includes one or more supports within the void region to support thermoelectric elements adjacent the voided region. The one or more supports are formed from a material having lower thermal conductivity than the slab and can be elastomeric to provide consistent support during expansion and contraction of the thermoelectric elements. In some embodiments, the slab can include pockets within the void region to fittingly receive the one or more supports.

DETAILED DESCRIPTION

Heat pumps for thermal cycling of biological samples utilize thermoelectric devices, typically Peltier devices or Peltier thermoelectric devices, which are unitary electronic devices that utilize the well-known Peltier effect to cause heat flow in either of two opposing directions depending on the direction of an electric current through the device. The present invention is applicable to systems that contain one or more such thermoelectric devices, but can utilize any type of heat pump devices. Each thermoelectric device is generally rectangular in shape, and when two or more thermoelectric devices are present, they are typically arranged contiguously in a rectangular array. When an array of thermoelectric devices is used, the array preferably consists of two to twenty thermoelectric devices, and in the most preferred embodiments, four to ten thermoelectric devices. The expression "thermoelectric device" is used herein to encompass both a single thermoelectric device and an array of thermoelectric elements and associated planar faces. The thermoelectric device or array of such devices is arranged to form a flat planar face that is in contact with the sample block, and through which heat is actively transferred across this area between the sample block and the thermoelectric devices. The sample block can either be coextensive with the flat area occupied by thermoelectric devices or can extend beyond it.

The term "void" or "void region" as used herein denotes areas in the heat-conductive slab of the heat sink that have been removed or left open, i.e., that form discontinuities in the heat-conductive slab material and are generally filled with air. The term "voids" further denotes depressions that extend only part way through the slab and are thus open only to one side of the slab, preferably the side facing the thermoelectric devices, and can further include complete removal of material (e.g. extend through the thickness of the slab and open at both sides of the slab). A void can be a reduction in thickness of up to 50%, 75%, 90%, or substantially complete removal of a portion or portions of the slab. The void is coextensive with an area occupied by one or more thermoelectric elements of the thermoelectric device that are not in contact with the slab. In some embodiments, all or a portion of the void can be filled with a non-conductive material or supports.

The slab, and the heat sink as a whole, which includes both the slab and the heat-dissipating fins, can be of any heat-conductive material, and is preferably made of a metal or a metal alloy. Aluminum, copper, and stainless steel are examples; others will be readily apparent to those familiar with the manufacture and/or use of thermal cyclers. The slab is either integral with the fins or the slab and fins can be manufactured as separated pieces that are joined by welding or other conventional joining means to achieve a thermal interface, which means that the contact is of a nature that heat transfer across the interface is substantially unobstructed by the interface itself. The contact between the slab and the thermoelectric devices is also a thermal interface despite the use of dissimilar materials. To achieve a thermal interface between the slab and the thermoelectric devices, materials such as GRAFOIL® (UCAR Company, Inc., Wilmington, Delaware, USA), Tgon (Laird Technologies), various thermal greases, or any suitable material can be placed between these components.

Due to non-linear behavior of thermal material interface exposed to clamping pressure, it was discovered that thermal uniformity of a sample block can change depending on the uniformity of the applied clamping forces. Thermal resistance of thermal material interfaces, such as Grafoil, exponentially decreases as pressure increases. Therefore, along certain regions (e.g. at corners and along the edges of a sample block) where the clamping force is considerably higher than the middle, there is more heat flux to the heat sink through thermoelectric elements. This results in the edges and corner regions being colder than the middle zones which can have an adverse effect on uniformity of biological products during thermocycling. In the case of a rectangular heat sink slab clamped to a rectangular array of thermoelectric elements, a thermal uniformity of an elliptical shape is observed in the sample block (see computer simulation in FIG. 4). To mitigate or compensate for this anomaly, an elliptical shaped central region is created on the base of the slab of the heat sink (see embodiments in FIGS. 1 and 5) surrounded by a void. The voids limits thermal conduction and as a result heat losses through the thermoelectric elements, keeping the edges desirably warmer which makes the sample block more thermally uniform. The void can be formed by removing material from the top surface, such as by machining or any suitable method, such that the thickness of the slab is reduced along the void region. In some embodiments, the heat sink can include one or more supports, such as O-rings, within the void, the supports having lower thermal conductivity than the slab material. In other embodiments, the void can be filled with partly or entirely with a material having lower thermal conductivity than the slab material (e.g. ceramic, elastomer).

While the features defining this invention are capable of implementation in a variety of constructions, the invention as a whole will be best understood by a detailed examination of specific embodiments. Several such embodiments are shown in the drawings.

Figure 1:
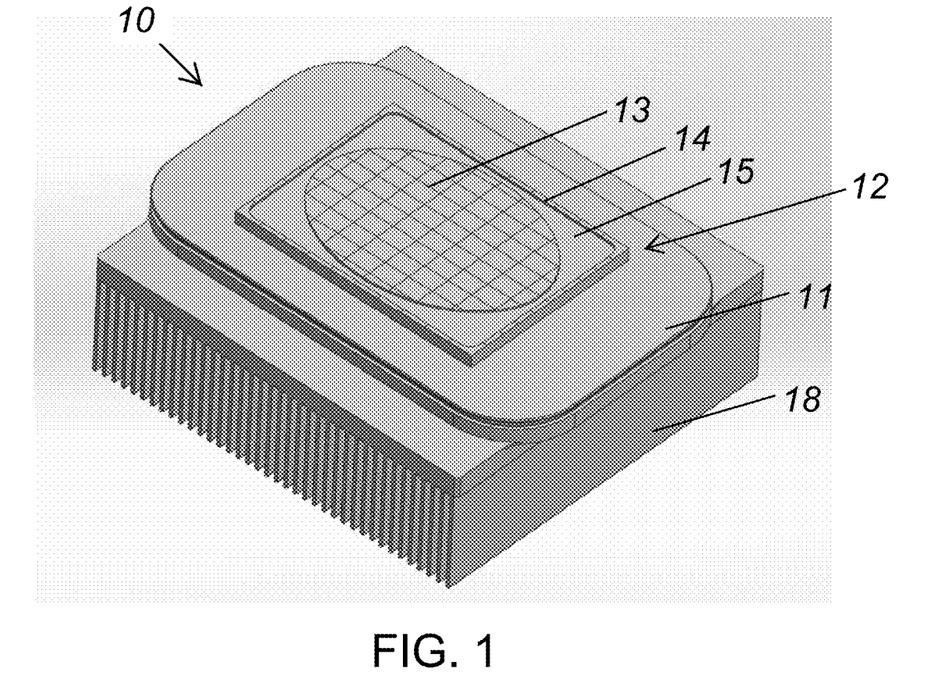
FIG. 1 is a perspective view of a heat sink portion of a thermoelectric device/heat sink assembly, in accordance with some embodiments.

FIG. 1 shows an exemplary heat sink 10 for a heat pump in accordance with aspects of the invention. The heat sink includes a slab 11 of heat-conductive material with a raised area 12 for placement against the planar face of the heat pump and heat dissipating fins 18 on an underside opposite the slab. The outer periphery 14 of the raised portion 12 being substantially the same dimensions as the area occupied by the thermoelectric devices. The raised portion 12 includes a raised central region 13 defined in an elliptical shape and surrounded by void region 15 that surrounds the raised central region 13 and is substantially contiguous.

Figure 2:
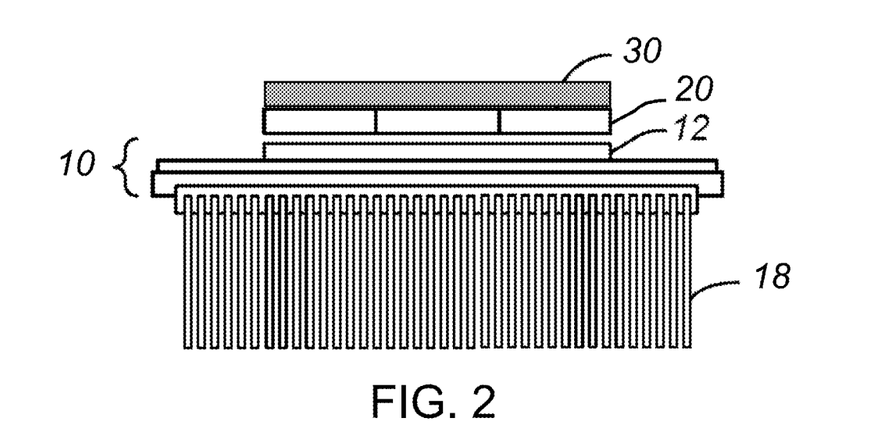
FIG. 2 is a side view of the heat sink portion within a sample block/thermoelectric device/heat sink assembly, in accordance with some embodiments.

FIG. 2 shows a side view of the heat sink 10 with raised area 12 of the slab 11 in profile with an array of thermoelectric devices 20 above it, the thermoelectric devices themselves raised a short distance above the slab to emphasize that a planar face formed by the surfaces of the thermoelectric devices 20 is coextensive with the raised area 12 of the slab. In use, the thermoelectric devices 20 are in direct contact with the raised area 12 of the slab. FIG. 2 also shows the heat-dissipating fins 18 that, together with the slab 11, constitute the heat sink. Above the thermoelectric devices 20 is the sample block 30, which likewise, is held in direct contact with an active face of the thermoelectric device 20 so as to provide uniform, precisely controlled thermal cycling of samples held within the sample block 30.

Figure 4:
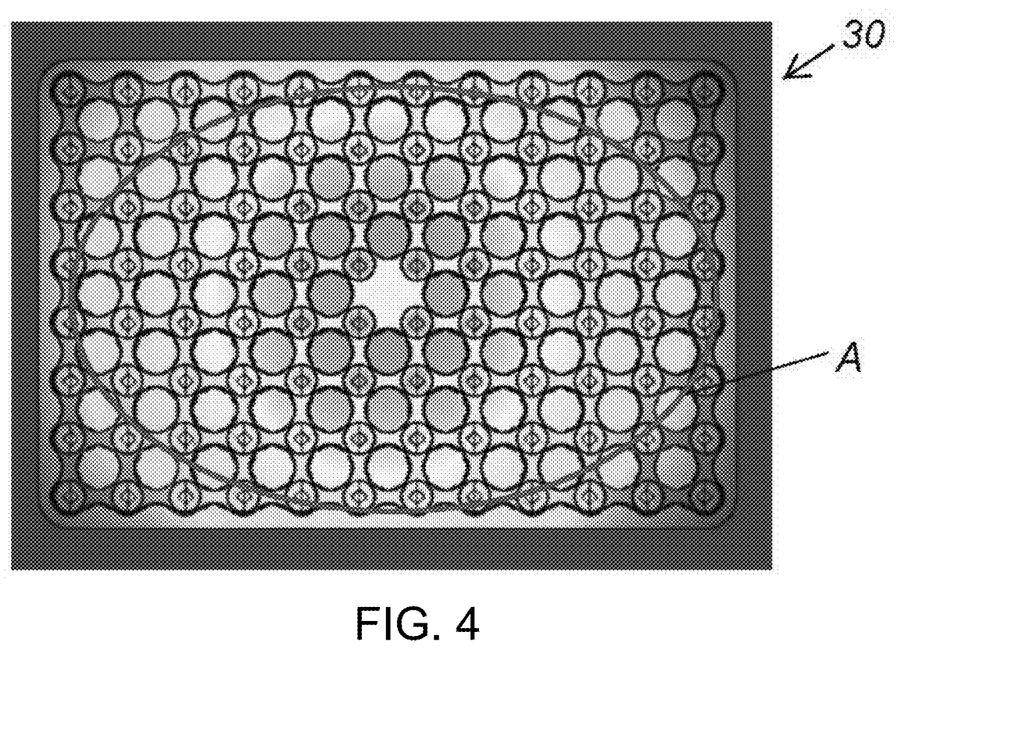
FIG. 4 is a heat map demonstrating thermal distribution in the example sample block when thermally cycled by a conventional thermoelectric device/heat sink assembly.

As shown in FIG. 1, the void region in this embodiment is a single contiguous void that circumscribes the central raised area 12, which is defined in an oval shape. This shape corresponds to the shape of the uneven temperature distribution of a rectangular slab without any voids (as can be seen in FIG. 4). When slab 11 is clamped with thermoelectric device and sample block, the forces applied to the slab are typically more concentrated along the corners and outer periphery. Thus, including a continuous void that encompasses the edges and corner areas reduces the thermal conductivity in these areas, thereby providing more uniform temperature across the sample block. While the raised central region 13 is shown as an oval shape here, it is appreciated that the raised central region 13 could be defined in various other shapes, depending on the dimensions of the slab, for example, raised area 112 could be formed as a circle (e.g. corresponding to a square slab).

Figure 3A:
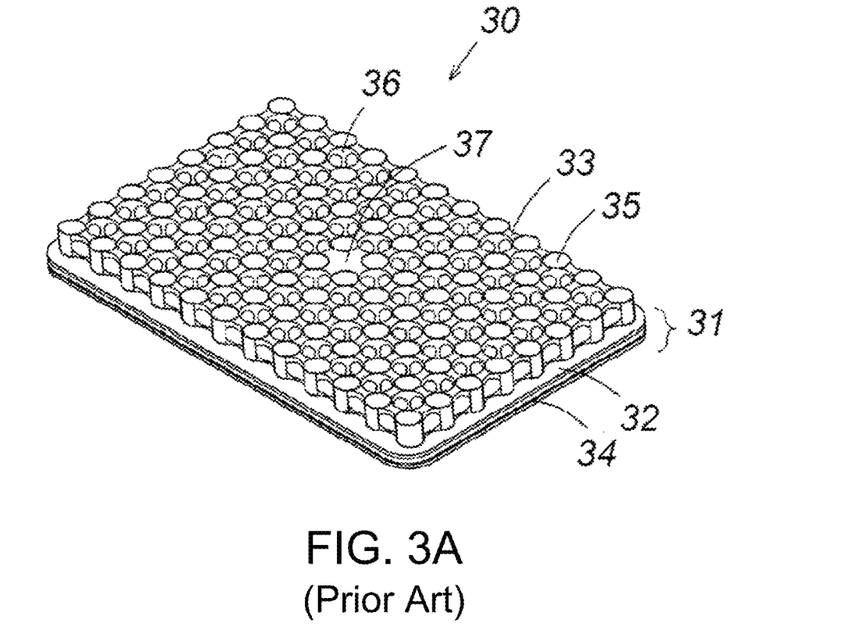
FIG. 3A is a perspective view of an example sample block suitable for use with a thermoelectric device/heat sink assembly, in accordance with some embodiments.

An example of a sample block is shown in FIG. 3A, which can be further understood by referring to U.S. Pat. No. 7,955,573, the entire contents of which are incorporated herein by reference for all purposes. FIG. 3A is a perspective view of a sample block 30 with a 12×8 array of 55 wells in a standard spacing. The block is a single piece of machined metal with a relatively thick base 31 that is slightly longer and wider than the remainder of the block to form a flange 32. Encircling the edge of the base is a groove 34 to accommodate an O-ring and engage with the periphery of the entire slab. The center section of the block that is bordered by the flange rises to the top surface 33 of the block. The top surface 33 is flat and planar and is interrupted by the openings of the sample wells 35. There are a network of hollow passages below the top surface 33. Further openings 36, positioned between the sample wells 35, open the hollows to the top surface 33 of the block. A central platform 37 occupies the space that would otherwise be occupied by a mass reduction hole 36 and facilitate alignment. Typically, the sample block 30 is used as a support block for a disposable plastic well plate (not shown) that has plastic wells corresponding to each well 34 in the block. While a particular sample block is shown here, it is appreciated that the concepts described herein are applicable to various other assemblies utilizing sample blocks having differing configurations, dimensions, number of wells and shapes (e.g. square).

Figure 3B:
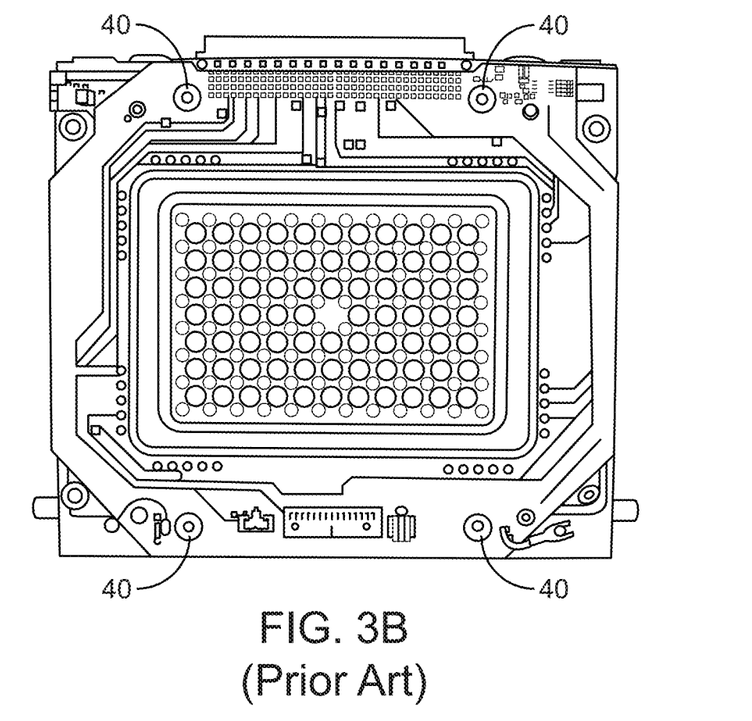
FIGS. 3B-3C illustrate exemplary clamping mechanisms that secure the components of the sample block/thermoelectric device/heat sink assembly.
Figure 3C:
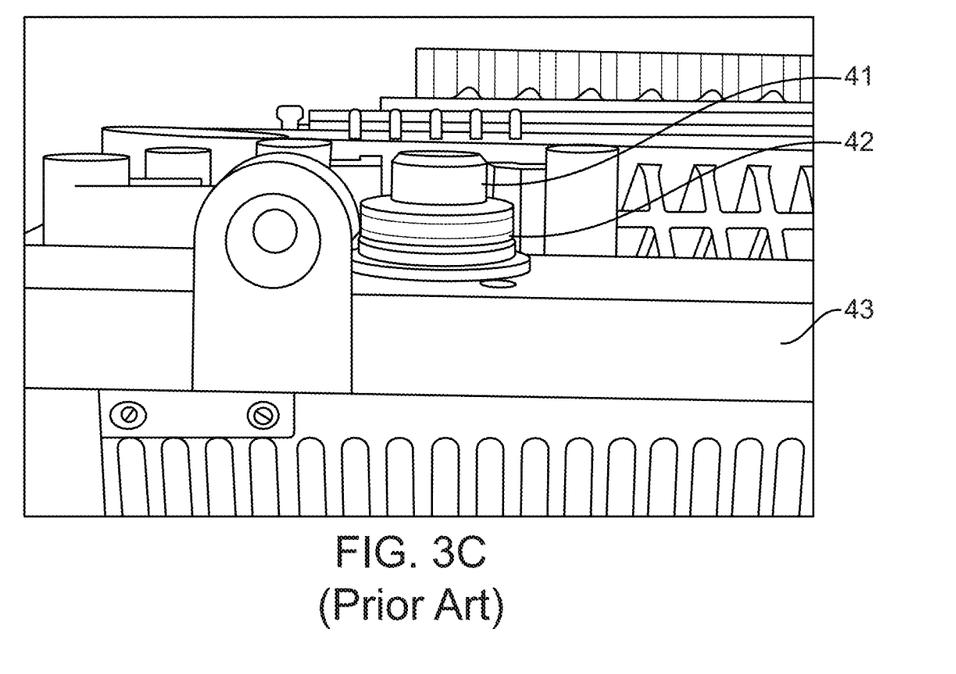

FIGS. 3B-3C show exemplary clamping mechanisms for securing the components of the sample block/thermoelectric device/heat sink assembly. Preferably, the clamping mechanism exerts sufficient clamping forces so that the components are securely engaged so as to ensure consistent thermal interfaces between adjacent components. To further improve thermal non-uniformity of heat pump a highly conductive material such as synthetic graphite (e.g. Tgon) can be used as a thermal interface between components which, due to its thermal properties, distributes heat more evenly. In the embodiment shown in FIGS. 3B-3C, the heat pump assembly is clamped together by means of four precision shoulder screws 40. Each screw 40 clamps retainer ring 43 against the heatsink 10 shown in FIG. 2. The clamping force is determined by a stack of four disk springs 42, as shown in FIG. 3C. As a result, the sample block 30, heat pump 20, any thermal material interface material (if present), and the heatsink 10 are held together by a predetermined force. In some embodiments, thermistors are embedded at the bottom of the sample block, which can be used to read and control the temperature of the sample block, for example six thermistor can be used to determine/monitor temperature distribution. Since there is some variation in the clamping force at each screw location due to variation in the disk springs, the clamping force becomes somewhat non-uniform. This variation contributes to thermal non-uniformity which is addressed by the improved head sink/heat pump configurations described herein. While a particular clamping configuration is described here, it is appreciated that the problems of non-uniformity due to variation in clamping forces are present in various other clamping approaches as well. Other clamping mechanisms may include fewer or more screws, alternative fasteners (e.g. snap-fit, interference fit), and screws or fasteners in other locations (e.g. a center screw extending through the center of the assembly). It is appreciated that the aspects of the improved heat pump and heat sink described herein can be modified as needed to address the particulars of any clamping approach.

FIG. 4 shows a heat map of the above-described sample block during thermal cycling within an assembly utilizing a conventional heat pump with a heat sink having a solid raised portion co-extensive with the sample block. The heat map demonstrates that area A has a differing temperature distribution. Notably, he corners regions and periphery where the applied clamping force is greater has reduced thermal resistance, thereby resulting in cooler regions, which adversely affects the thermal cycling of the individual samples within the sample wells of the sample block.

In some embodiments, in order to improve thermal uniformity even further a special thermal material interface is used, such as synthetic graphite (e.g., Tgon from Laird Technologies). Advantageously, Tgon is compliant enough to compensate for any non-flatness of surfaces, and at the same time has 4 times through thickness and 10 times in-plane thermal conductivity of copper.

In another aspect, since thermoelectric elements expand, contract and flex over the void area, one or more supports can be positioned within the void region so as to provide proper support for thermoelectric elements above the void region. Such supports can be formed of a material having low thermal conductivity and/or elastomeric material to provide support while allowing for expansion and contraction of the respective thermoelectric elements. The supports can be configured as one or more rubber O-rings, for example square profile O-rings sized to fit within each corner. It is appreciated that the support is not required to be round and could be any shape desired (e.g. square, rectangular, triangular, any suitable shape and/or any combination of shapes). Such an embodiment is shown in FIGS. 5-6.

Figure 5:
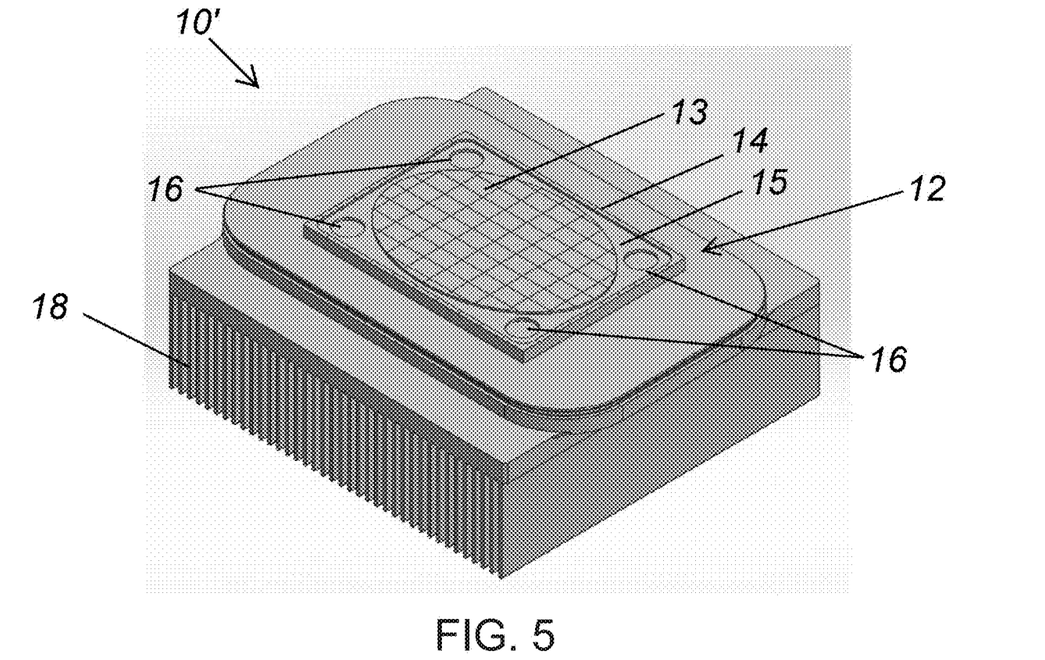
FIG. 5 is a perspective view of an alternative heat sink portion, in accordance with some embodiments.
Figure 6:
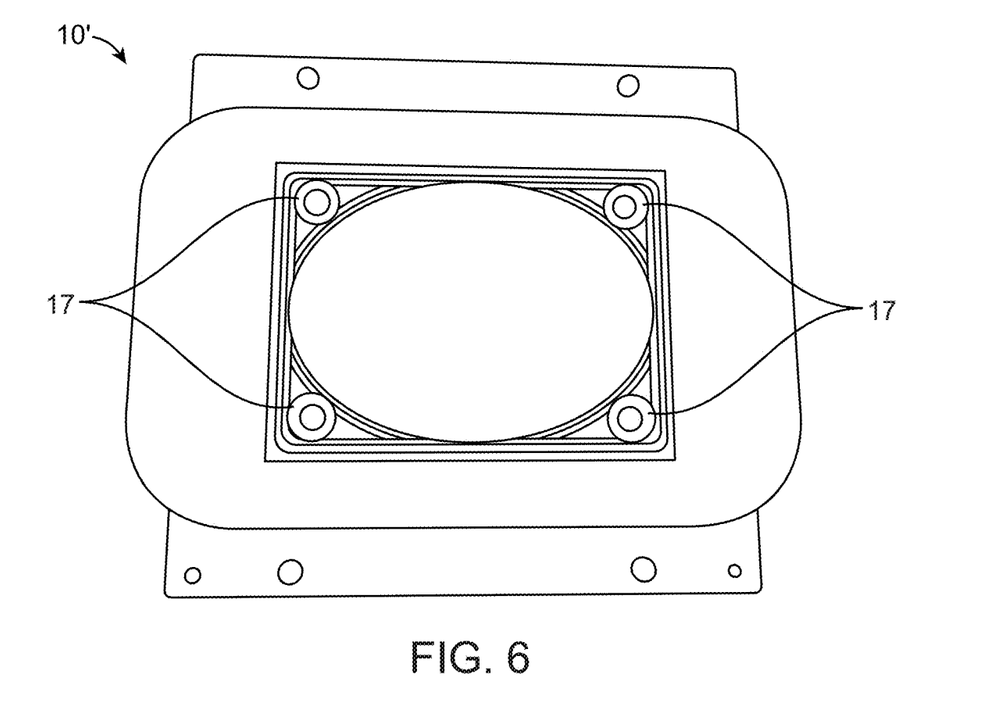
FIG. 6 is a top view the alternative heat sink portion in FIG. 5.

FIG. 5 shows a heat sink 10' having a rectangular slab 12 with a raised interior region with an elliptical raised central region 13 surrounded by void region 15 between the periphery 14 and the raised central region 13. Circular pockets 16 have been machined in each corner for insertion of O-rings 17 to facilitate assembly, as shown in FIG. 6. While rubber O-rings have been described here, it is appreciated that various other shapes and materials could be used. In other embodiments, the void could be filled partly or entirely with any suitable low thermal conductivity and/or elastomeric material.

Figure 7:
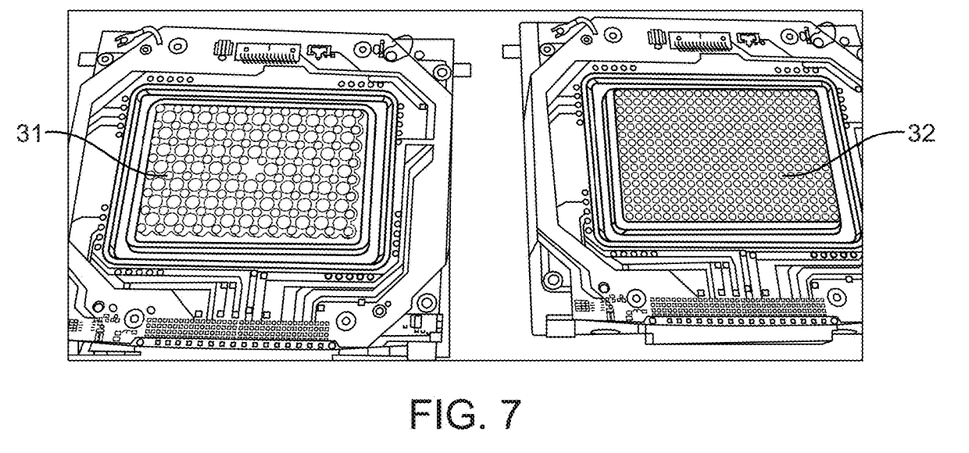
FIG. 7 shows conventional sample blocks with underlying thermoelectric heat pumps.
Figure 8:
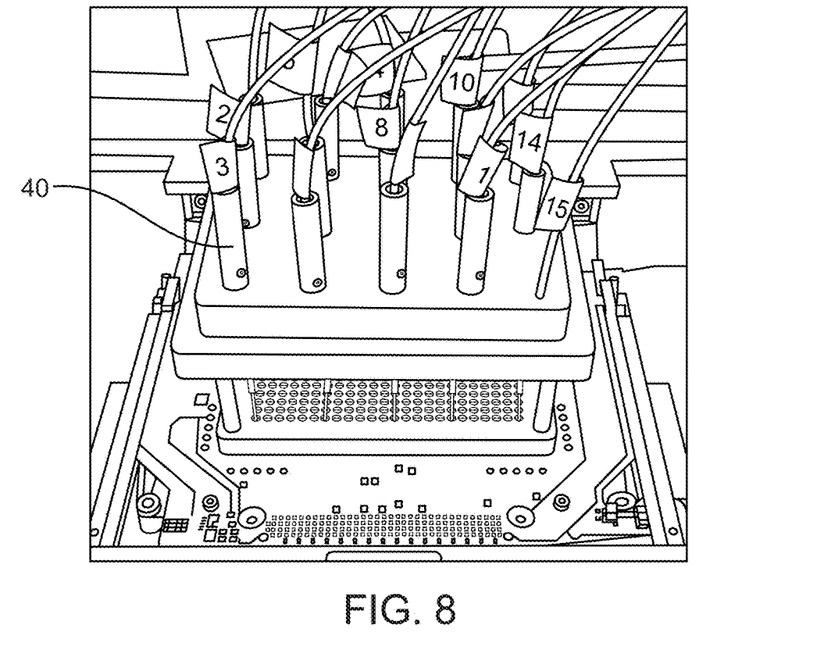
FIG. 8 shows an experimental setup for monitoring thermal distributions of sample blocks when thermally cycled.

FIG. 7-8 show an experimental setup to demonstrate the use and advantages of the above-described heat pump configuration. FIG. 7 shows two sample blocks having an underlying array of thermoelectric elements. Each array has close to 20 heat pumps. The device assembly at left includes sample block 31 having 96 wells, while the device at right includes sample block 32 having 384 wells. Thermal uniformity of the sample blocks was measured by means of 15 temperature probes 40, as shown in the setup of FIG. 8. The experiment results demonstrated a 35-40% reduction in thermal non-uniformity by use of the improved heat pump having an elliptical raised center region surrounded by a void region, such as that shown in FIGS. 1 and 5.

Figure 9:
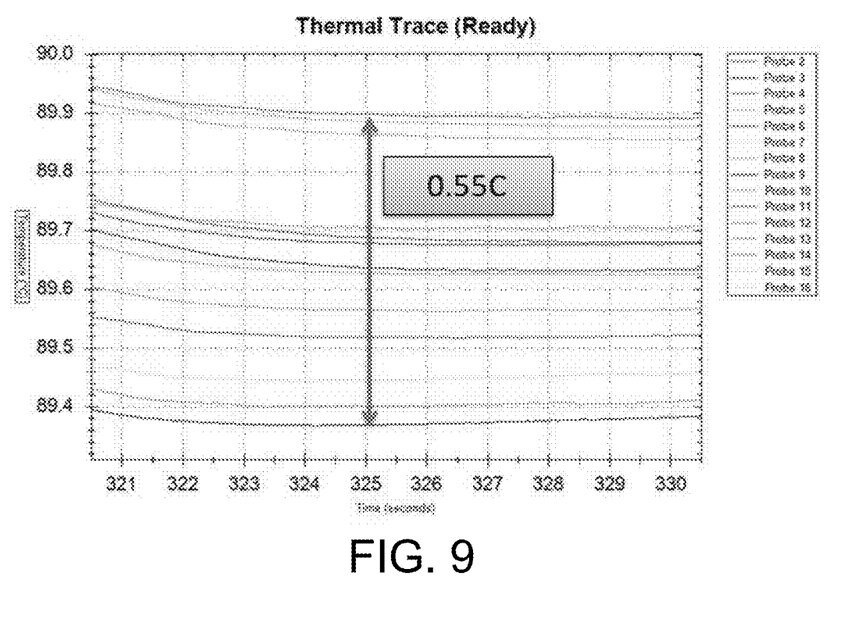
FIGS. 9-10 show experimental results demonstrating the improvement in thermal distribution in the sample block when thermally cycled with a heat pump in accordance with the aspects of the invention.
Figure 10:
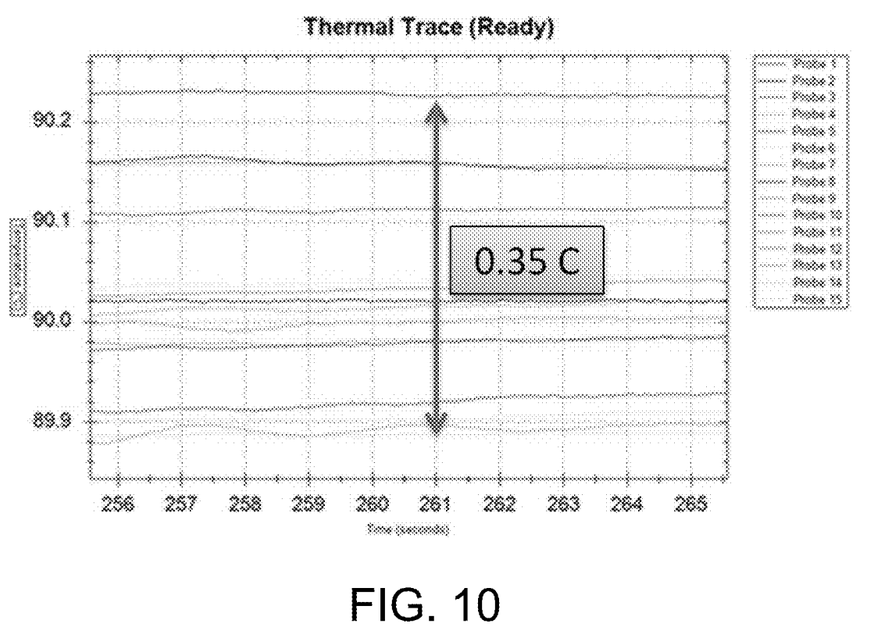

A typical thermal trace of the system operated with a conventional solid heat sink is shown in FIG. 9, while a thermal trace of the system retrofitted with an elliptical heat sink is shown in FIG. 10.

Figure 11:
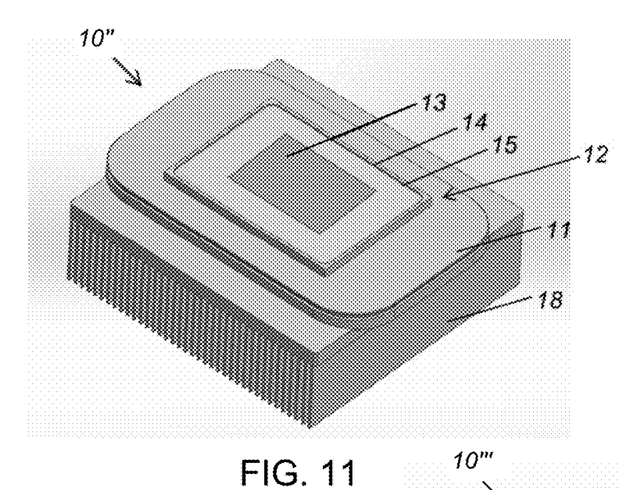
FIG. 11-13 show alternative embodiments of a heat sink portion of a thermoelectric device/heat sink assembly having central raised portions of varying regular, irregular and non-uniform shapes, sizes and numbers, in accordance with some embodiments.

FIG. 11 shows a perspective view of a heat sink portion 10" of a thermoelectric device/heat sink assembly similar to that in FIG. 1, however, the central raised portion 13 is rectangular in shape, in accordance with some embodiments.

Figure 12:
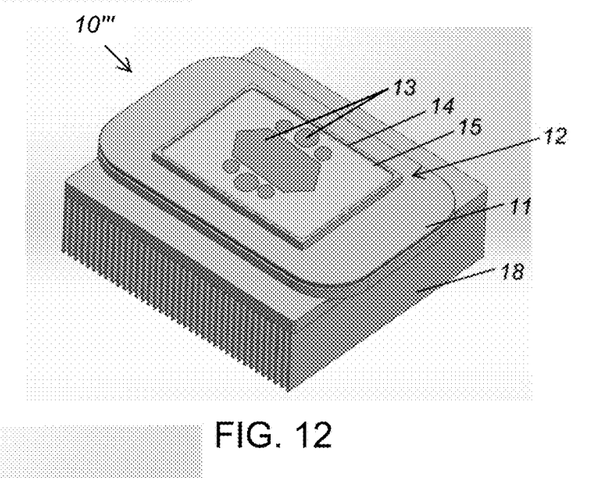

FIG. 12 shows a perspective view of a heat sink portion 10''' of a thermoelectric device/heat sink assembly having a central raised portion 13 of multiple, non-contiguous shapes, including an irregular shape and multiple circular shapes of varying size, in accordance with some embodiments.

Figure 13:
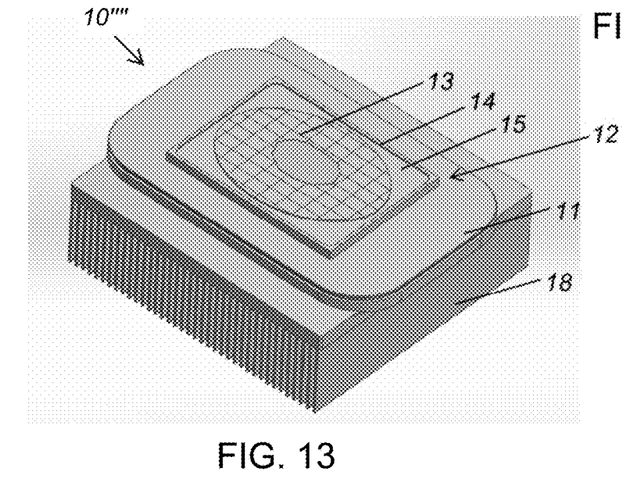

FIG. 13 shows a perspective view of a heat sink portion 10'''' of a thermoelectric device/heat sink assembly having a central raised portion 13 of a non-uniform donut shape having an interior void within the raised region, in accordance with some embodiments.

While the foregoing description describes various alternatives, still further alternatives will be apparent to those who are skilled in the art and are within the scope of the invention.

In the claims appended hereto, the term "a" or "an" is intended to mean "one or more." The term "comprise" and variations thereof such as "comprises" and "comprising," when preceding the recitation of a step or an element, are intended to mean that the addition of further steps or elements is optional and not excluded. All patents, patent applications, and other published reference materials cited in this specification are hereby incorporated herein by reference in their entirety. Any discrepancy between any reference material cited herein and an explicit teaching of this specification is intended to be resolved in favor of the teaching in this specification. This includes any discrepancy between an art-understood definition of a word or phrase and a definition explicitly provided in this specification of the same word or phrase.

What is claimed is:

1. A temperature control assembly for a thermal cycling of a multi-receptacle sample block, the assembly comprising:
   one or more thermoelectric devices comprising one or more thermoelectric elements operably coupled between an active face for thermal coupling with the sample block and a reference face for thermal coupling with a heat sink;
   a heat sink comprising a slab of thermally conductive material having a raised portion with a top surface thermally coupled with a planar face of the one or more thermoelectric devices, wherein the raised portion includes:
      an outer periphery of a rectangular shape that is co-extensive with the planar face of the one or more thermoelectric devices,
      a central raised region defined in a shape corresponding to an uneven temperature distribution, and
      a void region between the outer periphery and the central raised region, wherein the void region surrounds the central raised region,
   one or more supports comprising a material having a lower thermal conductivity than the slab, wherein the one or more supports are disposed within the void region so as to support the planar face of the one or more thermoelectric elements facing the void region, and
   a plurality of heat dissipating fins thermally coupled with an underside of the slab opposite the raised portion of the slab.

2. The assembly of claim 1 wherein the central raised region comprises a rounded, circular, or oval shape.

3. The assembly of claim 1 wherein the one or more supports comprises at least four supports disposed within the void region along the interior four corners of the rectangular outer periphery.

4. The assembly of claim 3 wherein the slab includes at least four pockets defined within the void region, wherein the pockets are dimensioned to fittingly receive the at least four supports.

5. The assembly of claim 4 wherein the least four supports comprise an elastomeric material.

6. The assembly of claim 5 wherein the least four supports comprise rubber O-rings.

7. The assembly of claim 1 further comprising:
a thermal interface material disposed between the one or more thermoelectric devices and the heat sink.

8. The assembly of claim 7 wherein the thermal interface material comprises a synthetic graphite.

9. The assembly of claim 1, wherein the void region comprises a single void that is contiguous about the central raised region.

10. The assembly of claim 1 wherein both the outer periphery and the central raised region define the top surface of the raised portion which contacts the planar face of the one or more thermoelectric elements, and wherein the one or more supports contact the planar face of the one or more thermoelectric elements facing the void region.

11. The assembly of claim 1 wherein the slab includes one or more pockets defined within the void region, wherein the pockets are dimensioned to fittingly receive the one or more supports.

12. The assembly of claim 1 wherein each of the one or more supports comprise an elastomeric material.

13. The assembly of claim 1 wherein each of the one or more supports comprise a rubber O-ring.

14. The assembly of claim 1 wherein the central raised region is a combination of shapes.

15. The assembly of claim 1 wherein the central raised region is an irregular or non-uniform shape.

16. The assembly of claim 1 wherein the void region comprises a region of reduced thickness such that the planar face is not in contact with the slab within the void region.

17. The assembly of claim 16 wherein the void region comprises a thickness of about 50% or less than a thickness of the central raised region.

18. The assembly of claim 16 wherein the void region comprises a thickness of about 25% or less than a thickness of the central raised region.

19. The assembly of claim 16 wherein the void region comprises a thickness of about 10% or less than a thickness of the central raised region.

20. A temperature control assembly for a thermal cycling of a sample block, the assembly comprising:
one or more thermoelectric devices comprising one or more thermoelectric elements operably coupled between an active face for thermal coupling with the sample block and a reference face for thermal coupling with a heat sink;
a heat sink comprising a slab of thermally conductive material having a raised portion with a top surface thermally coupled with a planar face of the one or more thermoelectric devices, wherein the raised portion includes:
an outer periphery that contacts the planar face of the one or more thermoelectric devices,
a central raised region defined in a shape corresponding to an uneven temperature distribution of the heat sink, and
a void region between the outer periphery and the central raised region, wherein the void region surrounds the central raised region,
a supporting material having a lower thermal conductivity than the slab disposed within the void region that contacts and supports the planar face of the one or more thermoelectric elements facing the void region when the assembly is clamped together, and
a plurality of heat dissipating fins thermally coupled with an underside of the slab opposite the raised portion of the slab.

21. The assembly of claim 20 wherein the material comprises a plurality of discrete supports, the plurality of discrete supports disposed within the void region to support the one or more thermoelectric elements facing the void region.

22. The assembly of claim 20 further comprising:
a thermal interface material disposed between the one or more thermoelectric devices and the heat sink.

* * * * *